United States Patent [19]
Ye

[11] Patent Number: 5,238,110
[45] Date of Patent: Aug. 24, 1993

[54] SECURED PLCC PACKAGE TRAY

[75] Inventor: Zhenrong Ye, Rocklin, Calif.

[73] Assignee: NEC Electronics Inc., Mountainview, Calif.

[21] Appl. No.: 834,904

[22] Filed: Feb. 12, 1992

[51] Int. Cl.$^5$ ............................................. B65D 85/30
[52] U.S. Cl. ...................................... 206/329; 206/328
[58] Field of Search ............................. 206/328–334, 206/564

[56] References Cited

U.S. PATENT DOCUMENTS

| | | | |
|---|---|---|---|
| 4,564,880 | 1/1986 | Christ et al. ........................ | 206/334 |
| 4,681,221 | 7/1987 | Chickanosky et al. ............. | 206/328 |
| 5,066,245 | 11/1991 | Walker ................................ | 206/329 |
| 5,076,427 | 12/1991 | Thompson et al. ................. | 206/232 |
| 5,101,975 | 4/1992 | Runyon et al. ..................... | 206/330 |

FOREIGN PATENT DOCUMENTS

| | | | |
|---|---|---|---|
| 0317487 | 12/1988 | Japan ................................... | 206/328 |
| 0199869 | 8/1989 | Japan ................................... | 206/328 |
| 0127256 | 5/1990 | Japan ................................... | 206/330 |

Primary Examiner—Jimmy G. Foster
Attorney, Agent, or Firm—Skjerven, Morrill, MacPherson, Franklin & Friel

[57] ABSTRACT

This invention discloses a tray for transporting Plastic Leaded Chip Carriers (PLCC's) which provides for secure alignment of a PLCC into an individual cavity of the tray and also holds the PLCC within the cavity so that the PLCC will not become misaligned. The invention accomplishes this without any contact with the leads of the PLCC thereby eliminating lead damage and minimizing the degradation of lead coplanarity. Furthermore, no modification of the PLCC is required.

9 Claims, 7 Drawing Sheets

SECURED PLCC PACKAGE TRAY

FIELD OF THE INVENTION

This invention relates to package and assembly technology for integrated circuits, and more specifically to transport trays for Plastic Leaded Chip Carriers (PLCC's).

DESCRIPTION OF PRIOR ART

Plastic Leaded Chip Carriers (PLCC's) are an increasingly important packaging option for integrated circuits in modern systems. This is due largely to the density of lead interconnect on the fabricated printed circuit board (PCB) that is afforded by use of this package type. Furthermore, since PLCC's are surface mounted, internal layers of the PCB are available for full routing use and are not interrupted by holes fully through the PCB as in through-hole technology. As such, the trend toward surface mount utilization and PLCC's in particular has accelerated in the last few years.

To assure reliable attachment to a PCB in the manufacturing process, it is necessary that each of the leads of a PLCC be in contact with a solder-paste film previously applied to the PCB. Solder-paste films are typically 8–10 mils thick and thus typically require PLCC leads to be coplanar with each other to within a 4 mil tolerance. Given the small size of each lead, if the PLCC is contacted or mishandled it is very easy to either bend the lead, to damage the shape of the lead, or to deflect or deform it sufficiently to violate the coplanarity specification. If the leads are damaged in any of these ways, the PLCC can be rendered virtually useless.

Figure 1:
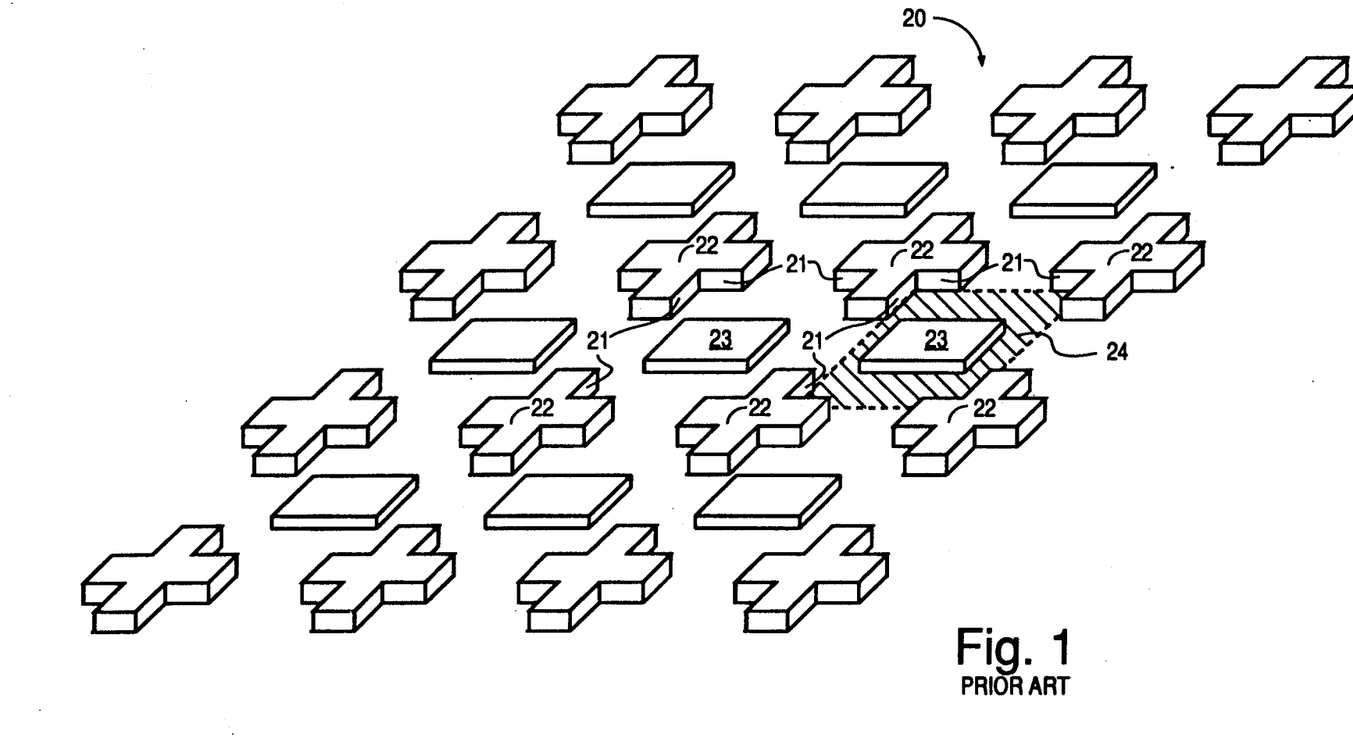
FIG. 1 is an illustration of a prior art PLCC package tray.

Methods of shipping and handling PLCC's have been devised which typically include a tray containing molded cavities into which fabricated PLCC's can be placed. FIG. 1 is an illustration of a common tray being utilized today. Four adjacent features 22 define a square cavity floor 24. The cavity walls 21 are formed by the side surfaces of features 22. A pad 23 in the center of cavity floor 24 supports the weight of a PLCC when placed into the cavity. Being so supported, the leads of a PLCC are raised off the cavity floor 24. Since no weight is placed on those leads, nominally there would be no bending or damage to those leads. However, this particular kind of a tray suffers from several disadvantages, the most notable of which is that a PLCC can move laterally, allowing the leads to come in contact with the cavity walls 21. This contact can result in lateral bending to those leads and a degradation of the coplanarity. Lateral movement can also result in positional and angular variations of the PLCC within the cavity, making any subsequent alignment sensitive operations that much more difficult.

Figure 2:
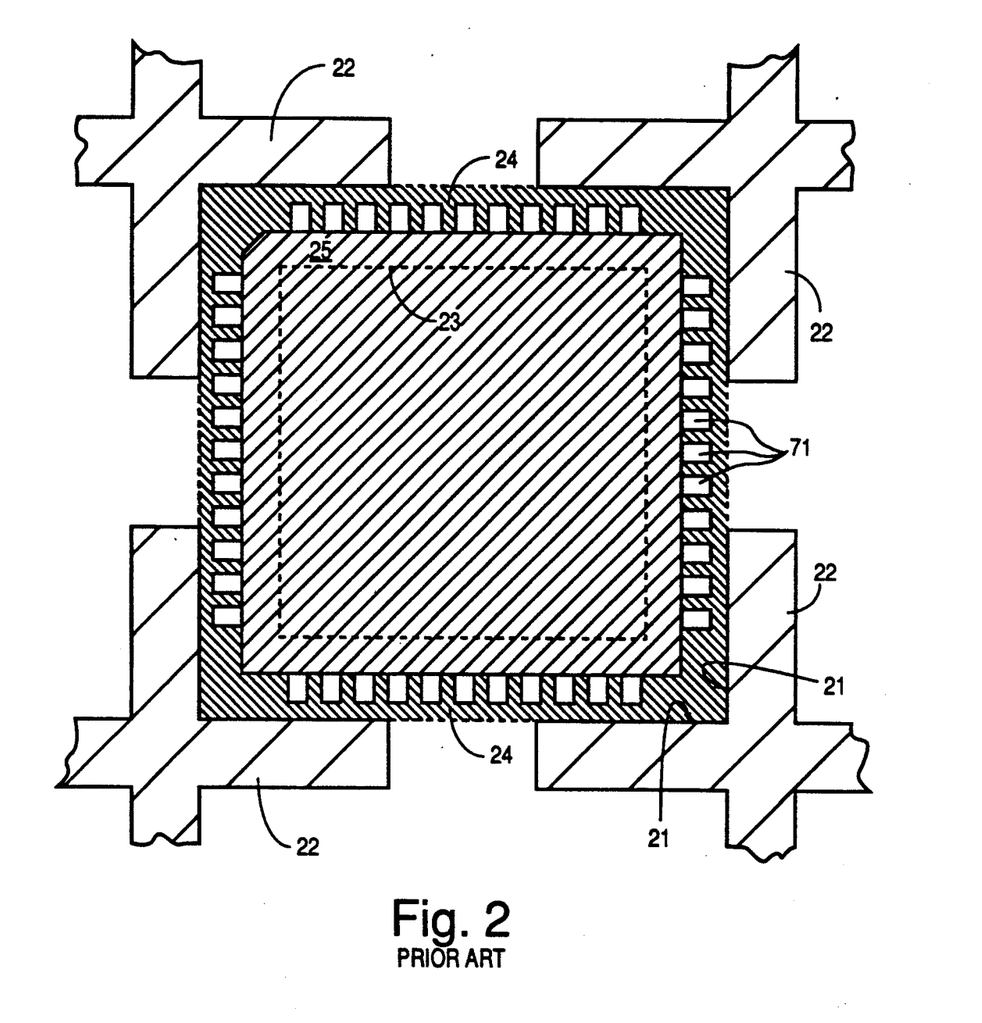
FIG. 2 is a top view illustration of the prior art tray of FIG. 1 with one PLCC positioned into an individual cavity.

FIG. 2 is a top view of a 44-pin PLCC 25 placed in a tray cavity of the type shown in FIG. 1. As can be seen from this figure, there is no constraint on the lateral movement of the PLCC 25, allowing leads 71 to physically contact the cavity walls 21.

Several attempts have been made to improve the situation with this type of tray. Soft material has been added in an attempt to minimize the damage due to contact of these leads 71 with the cavity walls 21. This has resulted in improvements but not elimination of the damage. Additionally, different types of packages have been developed which include protrusions or tabs from the corners of the package that will intentionally contact the cavity walls 21 first and thereby prevent the leads 71 from contacting the cavity walls 21. This type of package has been somewhat successful in improving the lead coplanarity. However, it has done so at the expense of the area when placed upon the PCB.

SUMMARY OF THE PRESENT INVENTION

The primary object of the present invention is to eliminate damage to PLCC leads by ensuring that no leads are touched during any movement or shipment of this tray. Another object is to properly position a PLCC precisely in the center of the cavity. A further object of the present invention is to lower the reject rate of the manufactured PLCCs, thereby raising the quality apparent to the end customer.

In accordance with the present invention, guide structures are provided in the corners of the IC package tray cavities which will provide for alignment of a PLCC into a cavity and will prevent lead contact with the walls of this cavity. Furthermore, the present invention will allow totally standard PLCC's to be utilized without modification. Other objects, advantages and novel features of the present invention will become apparent from the following detailed description of the invention when considered in conjunction with the accompanying drawings.

DETAILED DESCRIPTION OF THE PREFERRED EMBODIMENTS

Figure 3:
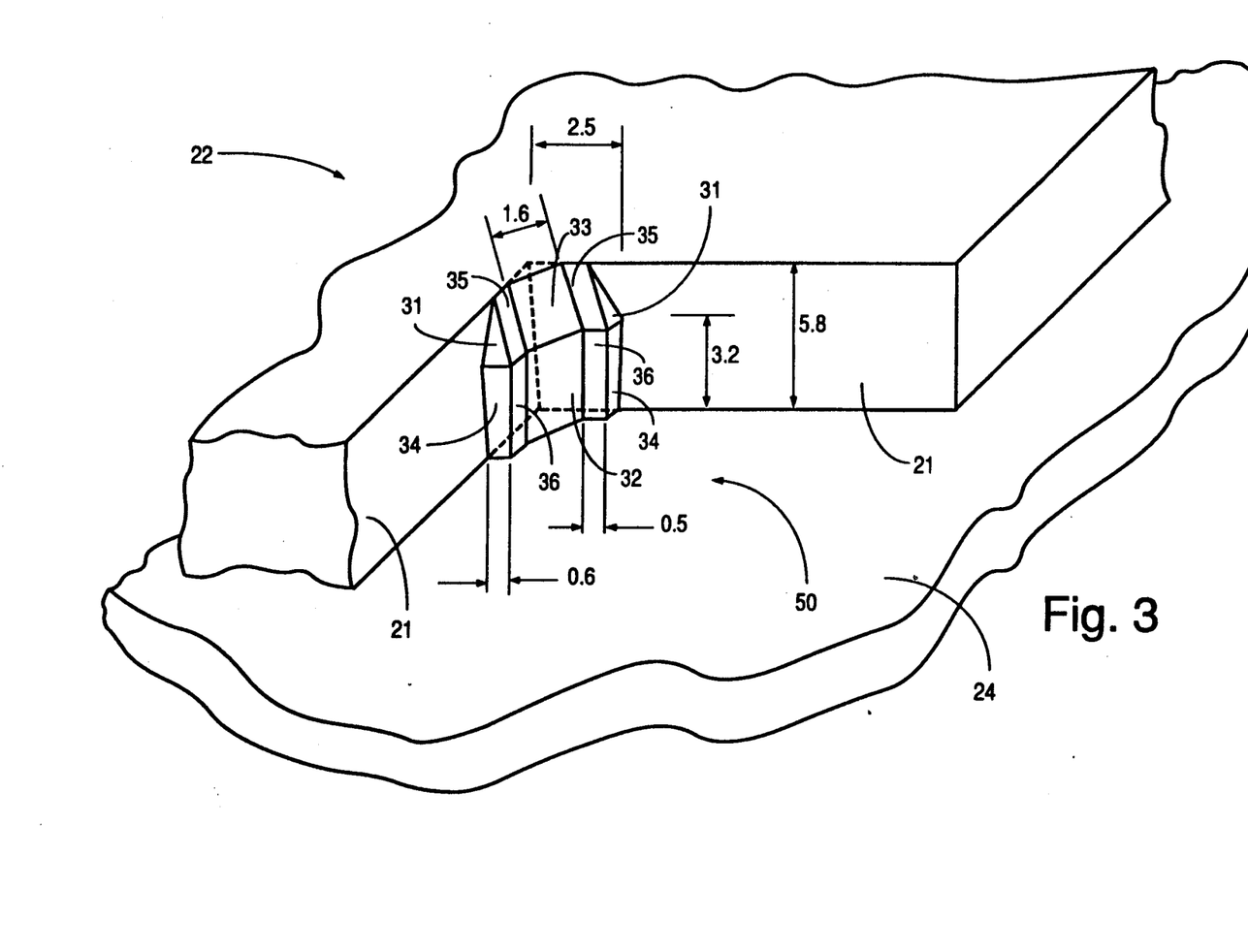
FIG. 3 is an illustration of a guide structure of the present invention, showing the detail of one of the corners of the PLCC tray cavity wall.

Guide structures are included in each of the four corners of each cavity of the tray to position and hold a PLCC in the optimal position at the center of the cavity. Referring now to FIG. 3, guide structure 50 is located in the inside corner of cavity wall 21 and is comprised of many surfaces. In the direction toward the cavity floor 24, surfaces 31, 33 and 35 slope toward the cavity and serve to guide the PLCC, when inserted from above, away from the cavity wall 21 and toward the center of the cavity to its proper position. Surfaces 32 and 36 are normal to cavity floor 24 and serve to hold the PLCC in its proper position once it is fully inserted. When viewed from above, the 45° angle of surfaces 33 and 32 with respect to cavity walls 21 correspond to the single chamfered corner of the PLCC which is used to identify proper orientation of the PLCC.

Figure 4:
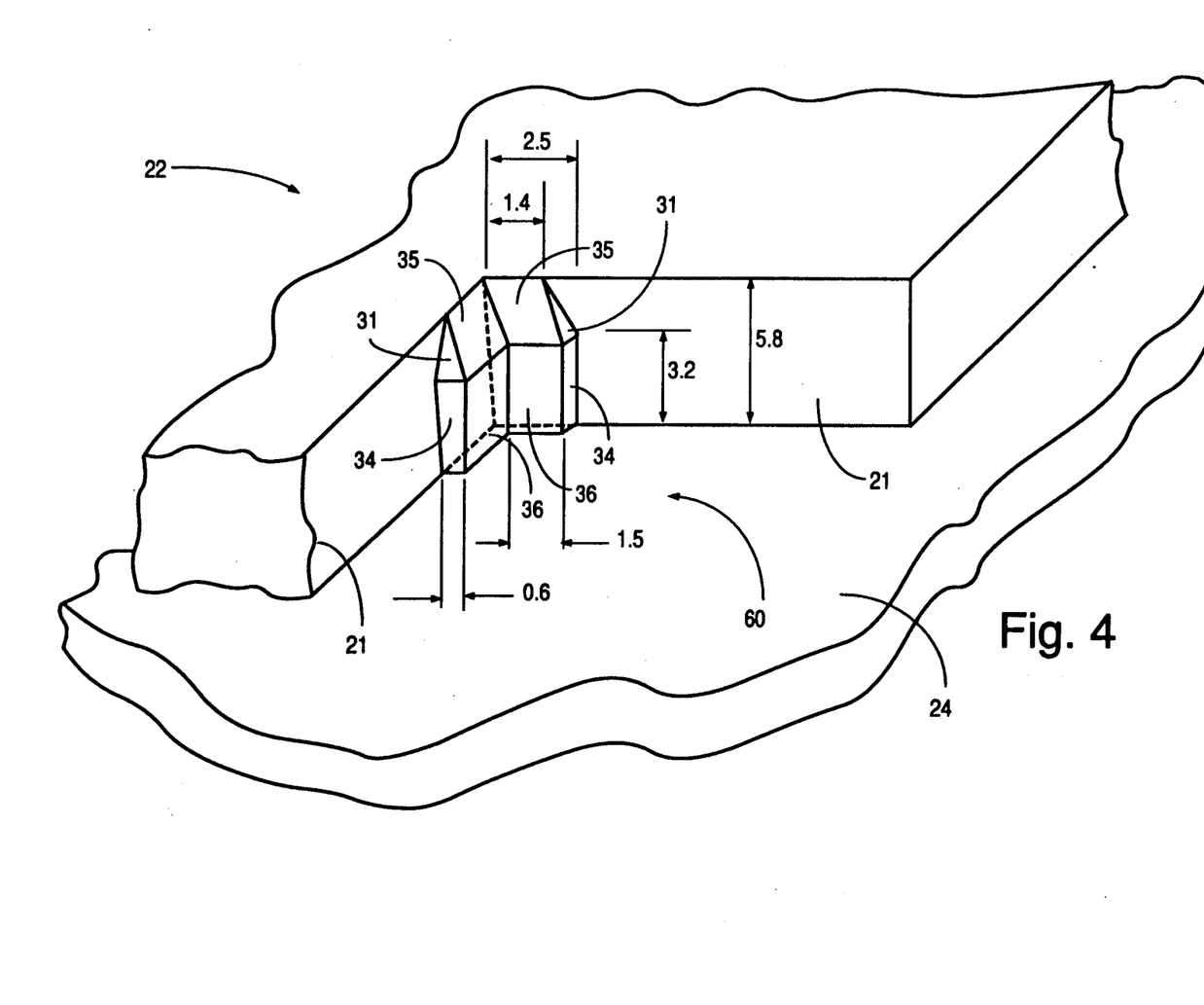
FIG. 4 is an illustration of a guide structure of the present invention, showing the detail of three of the corners of the PLCC tray cavity wall.

Referring now to FIG. 4, guide structure 60 is comprised of a variety of surfaces with the same function as guide structure 50 shown in FIG. 3, but guide structure 60 reflects the non-chamfered shape of the other three corners of a PLCC. Surfaces 31 and 35 serve to properly position a PLCC toward the center of the cavity as it is being inserted from above. Surfaces 36 are normal to cavity floor 24 and serve to hold the PLCC in correct position in analogous manner as surfaces 32 and 36 of FIG. 3.

Figure 5:
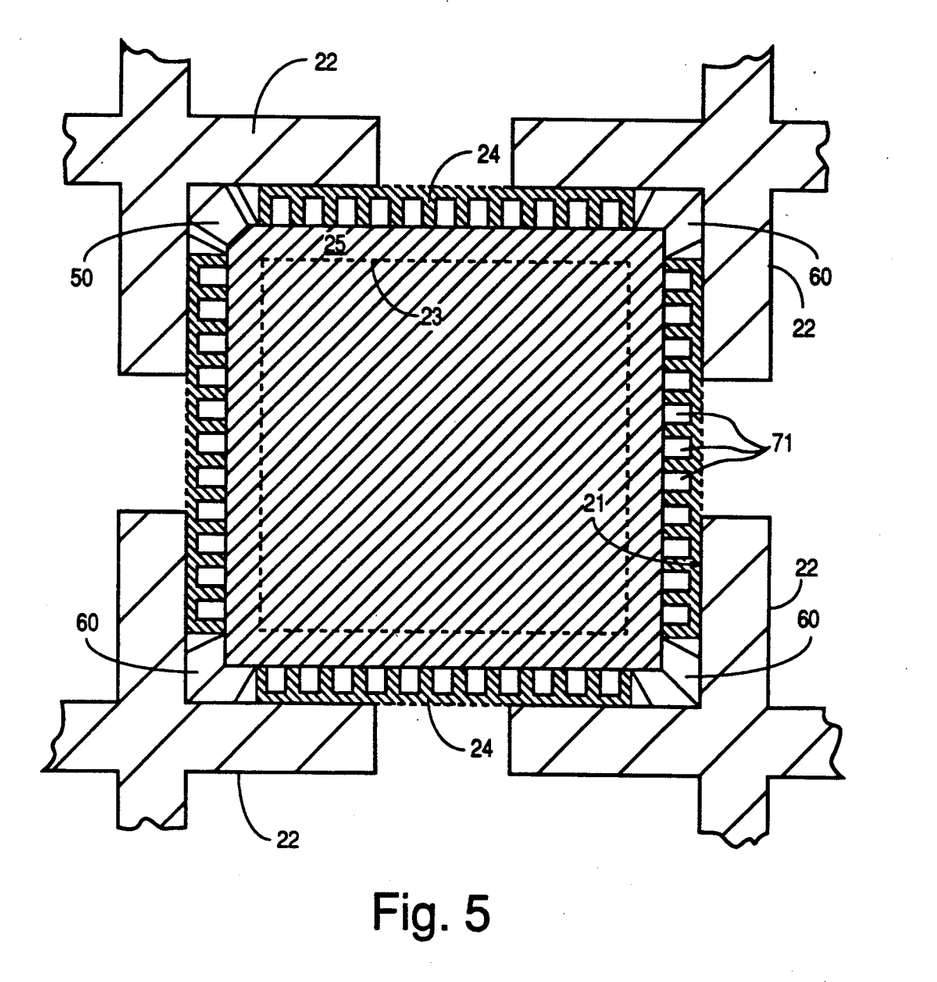
FIG. 5 is a top view of a PLCC positioned into an individual cavity, and showing the guide structures of the present invention holding the PLCC into position.

Referring now to FIG. 5, a PLCC 25 is shown in this top view drawing properly inserted. A plurality of leads 71 is shown. Pad 23 on the cavity floor 24 provides the base onto which PLCC 25 is resting. One of either guide structures 50 or 60 is located in each of the four corners of the cavity, and together prevent any lateral movement of PLCC 25. It can be appreciated from analysis of this figure that the present invention affords an environment to PLCC 25 that will properly position and hold PLCC 25 in a tray cavity without contact between any of leads 71 and cavity walls 21.

Figure 6:
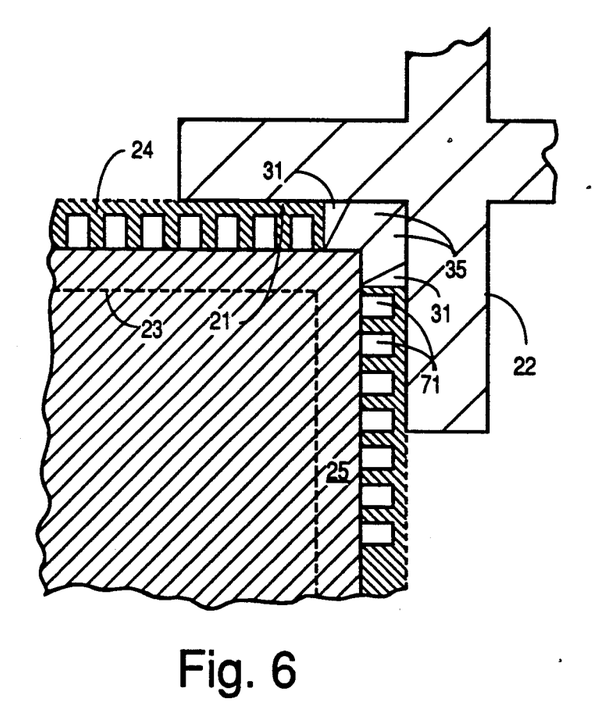
FIG. 6 is a top view of the detail of a guide structure of the present invention, in contact with a PLCC positioned into an individual cavity.

While FIG. 5 shows a top view of an entire cavity with a guide structure 50 or 60 in each of the four corners, reference should be made to FIG. 6 which shows the detail of one of the corners and will serve to more fully describe the function of guide structure 60 of the present invention.

From this top view looking toward cavity floor 24, surfaces 31 and 35 slope toward the cavity, and it can be clearly appreciated that these surfaces 31 and 35 will serve to guide PLCC 25 away from cavity walls 21 and into this proper position as PLCC 25 is being inserted from above. Also evident from this figure is the fact that none of the leads 71 of PLCC 25 come in contact with either the guide structure 60 or the cavity wall 21.

Figure 7:
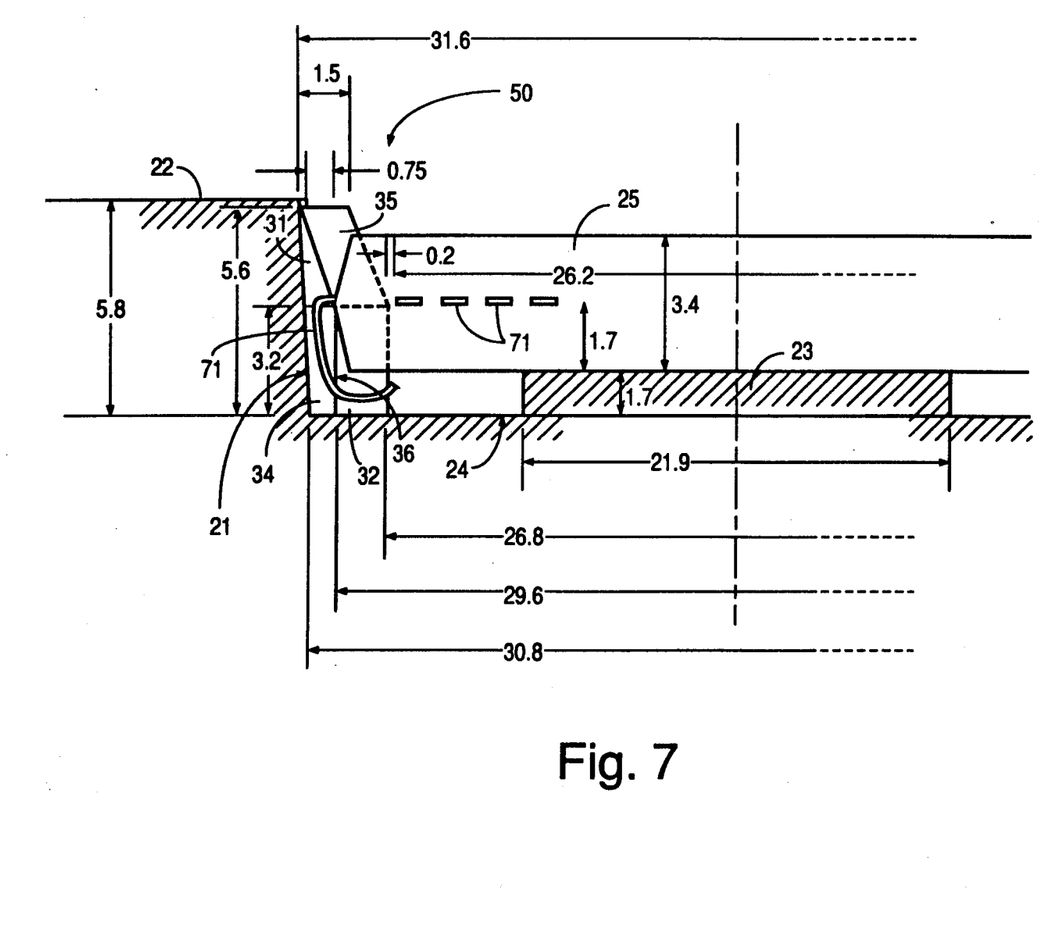
FIG. 7 is a side view of the present invention showing a PLCC properly positioned into a tray cavity.

FIG. 7 is a side view of a fully inserted PLCC 25 resting upon pad 23. Surfaces 32 and 36 of guide structure 50 contact PLCC 25 and ensure spacing between leads 71 and cavity wall 21. As in the prior art, pad 23 prevents contact between leads 71 and cavity floor 24.

As can be appreciated from the illustrations discussed, the present invention serves to accomplish several improvements over the prior art. Most notably a PLCC is securely held in place without any leads of the PLCC coming in contact with any portion of the tray. This serves to reduce incidences of bent leads, including the degradation of coplanarity of those leads. Secondly, the structures of the present invention serve to guide a PLCC, when inserted, to the center of the cavity and prevent angular variations in position. With more accurate registration tolerances, the PLCC can be picked up by robotics equipment and placed with greater precision into a variety of receiving PLCCs including burn-in equipment as well as assembly equipment that will be utilized when placing the PLCC onto a PCB. Additionally, the present invention serves to keep an inserted PLCC in its proper location in the tray. While the above provides a full and complete disclosure of the preferred embodiments of the present invention, various modifications, alternate constructions, and equivalents may be employed without departing from the true spirit and scope of the invention. Therefore the above description and illustration should not be construed as limiting the scope of the invention which is defined by the independent claims.

What is claimed is:

1. An apparatus for transporting a PLCC, the PLCC being of a type having a plurality of "J" leads extending along the sides and curved beneath the bottom thereof, the apparatus having a guide structure in each of four corners thereof for guiding a PLCC into correct rotational and translational alignment within the apparatus as the PLCC is inserted into the apparatus from above and for maintaining the alignment of the PLCC once inserted, while preventing contact between any portion of the leads of the PLCC and the apparatus, wherein each of the guide structures comprises:

a plurality of holding surfaces for contacting a respective corner region of an inserted PLCC;

a plurality of spacer surfaces, each substantially perpendicular to a corresponding holding surface, for isolating the leads of an inserted PLCC;

a plurality of first guide surfaces, each intersecting a corresponding holding surface and sloping, when viewed from above, in a direction inward of and toward the center of the apparatus, for guiding a respective corner region of a PLCC into contact with the corresponding holding surfaces as the PLCC is inserted into the apparatus from above; and a plurality of second guide surfaces, each intersecting a corresponding spacer surface and sloping, when viewed from above, in a direction inward of the apparatus and opposite the respective corner of the apparatus, for guiding the respective corner region of the PLCC into contact with respective first guide surfaces as the PLCC is inserted into the apparatus from above, by guiding a lead of the PLCC nearest the respective corner region of the PLCC in a direction away from the respective corner of the apparatus.

2. An apparatus as in claim 1 for a rectangular PLCC having first, second, and third corners with a first contour, and having a fourth corner with a second contour, wherein the holding surfaces of three of the guide structures follow the first contour and wherein the holding surfaces of a fourth guide structure follow the second contour.

3. An apparatus as in claim 1 further comprising a support pad for supporting the bottom of an inserted PLCC.

4. An apparatus as in claim 1 wherein the holding surfaces are substantially vertical.

5. An apparatus as in claim 1 wherein each of the spacer surfaces are positioned approximately 0.2 mm from a respective adjacent lead of an inserted PLCC.

6. A tray for transporting PLCCs, the PLCCs being of a type having a plurality of "J" leads extending along the sides and curved beneath the bottom thereof, the tray comprising a plurality of structures defining individual cavities, each of the cavities for receiving a PLCC when inserted from above, each of the cavities having four internal corners and a cavity floor defined by a portion of the plurality of structures, each internal corner comprising a guide structure therein for guiding a PLCC into correct rotational and translational alignment within the cavity as the PLCC is inserted into the cavity from above, and for maintained the alignment of the PLCC once inserted while preventing the contact between any portion of the leads of the PLCC and the structures of the tray, wherein each of the guide structures comprises:

a plurality of holding surfaces, each substantially perpendicular to the cavity floor, for contacting a respective corner region of an inserted PLCC;

a plurality of spacer surfaces, each substantially perpendicular to a corresponding holding surface and substantially perpendicular to the cavity floor, for providing spacing between the leads of an inserted PLCC and the tray;

a plurality of first guide surfaces, each intersecting a corresponding holding surface and sloping, when viewed from above, in a direction inward of and toward the center of the cavity, for guiding a respective corner region of a PLCC into contact with the corresponding holding surfaces as the PLCC is inserted into the cavity from above; and a plurality of second guide surfaces each intersecting a corresponding spacer surface and a corresponding first guide surface, each of the second guide surfaces sloping, when viewed from above, in a direction inward of the cavity and opposite the respective internal corner of the cavity, for guiding the respective corner region of the PLCC into contact with respective first guide surfaces as the PLCC is inserted into the cavity from above, by guiding a lead of the PLCC nearest the respective corner region of the PLCC in a direction away from the respective internal corner of the cavity.

7. A package tray as in claim 6 for rectangular PLCCs each having first, second, and third corners with a first contour, and each having a fourth corner with a second contour, wherein the holding surfaces of three of the guide structures of a cavity follow the first contour and wherein the holding surfaces of a fourth guide structure of the cavity follow the second contour.

8. A package tray as in claim 6 further comprising a support pad projecting from the floor of each of the cavities for supporting the bottom of a PLCC inserted within each of the cavities.

9. A package tray as in claim 6 wherein each of the spacer surfaces are positioned approximately 0.2 mm from a respective adjacent lead of an inserted PLCC.

* * * * *